(12) United States Patent
Weng et al.

(10) Patent No.: US 8,129,762 B2
(45) Date of Patent: *Mar. 6, 2012

(54) IMAGE SENSOR

(75) Inventors: Fu-Tien Weng, Shin Chu (TW);
Yu-Kung Hsiao, Yang Mei Town (TW);
Hung-Jen Hsu, Taoyuan (TW); Yi-Ming Dai, Hsin-Chu (TW); Chin Chen Kuo, Taipei (TW); Te-Fu Tseng, Hsin-Chu (TW); Chih-Kung Chang, Hsin-Chu (TW); Jack Deng, Jhunan Township (TW); Chung-Sheng Hsiung, Zhudong Town (TW); Bii-Junq Chang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 213 days.

This patent is subject to a terminal disclaimer.

(21) Appl. No.: 12/347,427

(22) Filed: Dec. 31, 2008

(65) Prior Publication Data
US 2009/0104547 A1    Apr. 23, 2009

Related U.S. Application Data

(60) Division of application No. 11/156,794, filed on Jun. 20, 2005, now Pat. No. 7,507,598, which is a continuation-in-part of application No. 10/781,217, filed on Feb. 17, 2004, now Pat. No. 6,964,916, which is a continuation-in-part of application No. 10/456,759, filed on Jun. 6, 2003, now Pat. No. 6,956,253.

(51) Int. Cl.
*H01L 27/148* (2006.01)

(52) U.S. Cl. . 257/231; 257/414; 257/431; 257/E21.617; 257/E27.153

(58) Field of Classification Search .................. 257/231, 257/288, 290, 291, 294, 414, 428, 431, 432, 257/440, 443–444, E31.075, E31.078, E31.081, 257/E31.084, E27.153, E27.159, E27.163, 257/E21.617

See application file for complete search history.

(56) References Cited

U.S. PATENT DOCUMENTS 5,266,501 A    11/1993  Imai
5,426,058 A    6/1995   Nakai et al.
(Continued)

OTHER PUBLICATIONS

Press Release, Hsin-Chu, Taiwan—(Business Wire)—May 15, 2000—"TSMC begins volume production of CMOS image sensors" http://www.dpreview.com/news/0005/00051503tsmc_cmos.asp, 3 pages, visited Mar. 11, 2003.

*Primary Examiner* — Khiem D Nguyen
*Assistant Examiner* — Su Kim
(74) *Attorney, Agent, or Firm* — Duane Morris LLP; Steven E. Koffs

(57) ABSTRACT

A method is provided for processing a substrate. The substrate has at least one filter region, a plurality of bond pads, and a plurality of scribe lines arranged around the filter region and bond pads. A first planarization layer is formed above the substrate. The planarization layer has a substantially flat top surface overlying the filter region, the bond pads and the scribe lines. At least one color resist layer is formed over the first planarization layer and within the filter region while the first planarization layer covers the bond pads and the scribe lines.

21 Claims, 14 Drawing Sheets

U.S. PATENT DOCUMENTS

| | | | |
|---|---|---|---|
| 5,672,519 A | 9/1997 | Song et al. | |
| 5,698,892 A * | 12/1997 | Koizumi et al. | 257/620 |
| 5,747,790 A * | 5/1998 | Shimomura et al. | 250/208.1 |
| 5,854,091 A | 12/1998 | Back et al. | |
| 5,866,919 A | 2/1999 | Kwon et al. | |
| 6,157,017 A | 12/2000 | Kim | |
| 6,171,885 B1 | 1/2001 | Fan et al. | |
| 6,214,777 B1 | 4/2001 | Lan et al. | |
| 6,274,917 B1 | 8/2001 | Fan et al. | |
| 6,344,369 B1 | 2/2002 | Huang et al. | |
| 6,369,417 B1 | 4/2002 | Lee | |
| 6,395,576 B1 | 5/2002 | Chang et al. | |
| 6,482,669 B1 | 11/2002 | Fan et al. | |
| 6,495,813 B1 | 12/2002 | Fan et al. | |
| 6,582,988 B1 | 6/2003 | Hsiao et al. | |
| 6,617,189 B1 | 9/2003 | Chen et al. | |
| 6,632,700 B1 * | 10/2003 | Fan et al. | 438/70 |
| 6,656,762 B2 * | 12/2003 | Kim | 438/70 |
| 6,849,533 B2 | 2/2005 | Chang et al. | |
| 6,861,207 B2 * | 3/2005 | Hsu et al. | 430/321 |
| 6,956,253 B2 * | 10/2005 | Weng et al. | 257/232 |
| 6,964,916 B2 * | 11/2005 | Kuo et al. | 438/462 |
| 2002/0050629 A1 | 5/2002 | Seshan et al. | |
| 2004/0265752 A1 | 12/2004 | Hsu et al. | |
| 2006/0138578 A1 * | 6/2006 | Lim | 257/432 |
| 2006/0263003 A1 * | 11/2006 | Asai et al. | 385/14 |

* cited by examiner

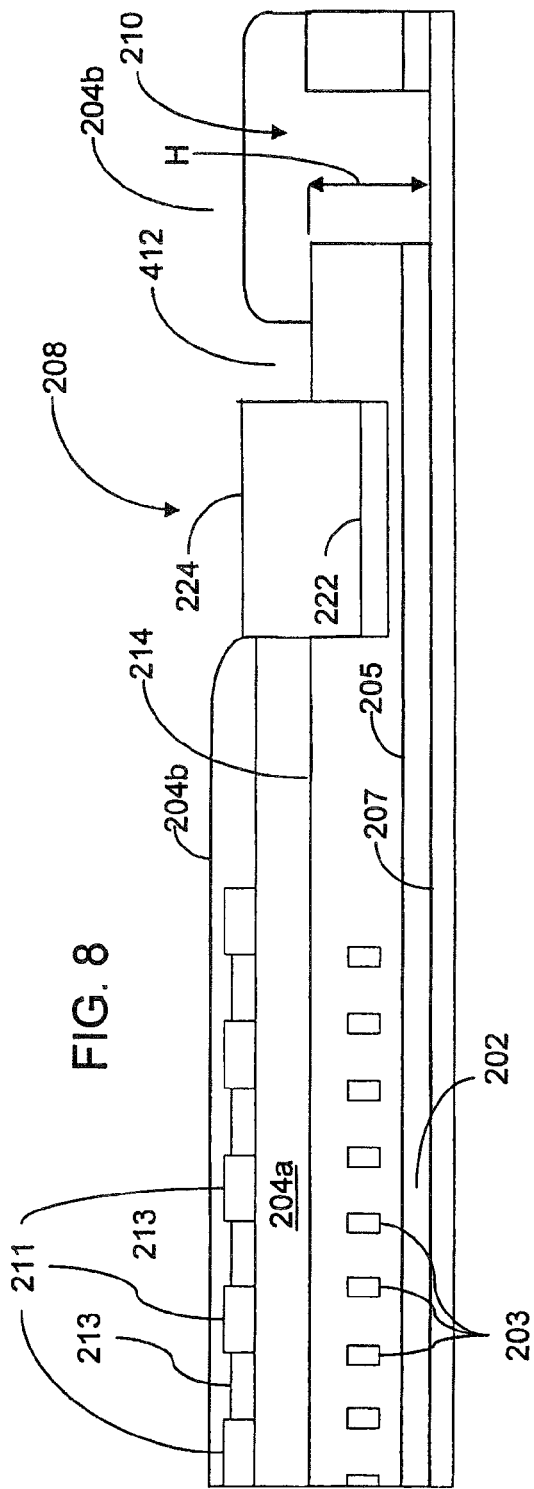
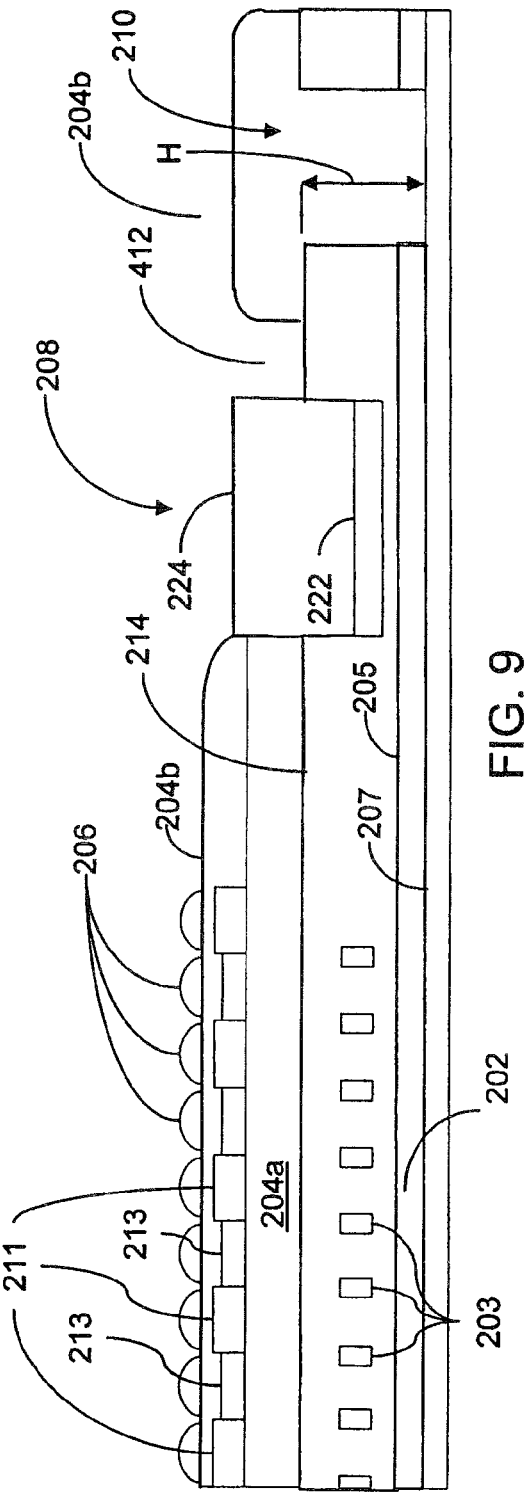

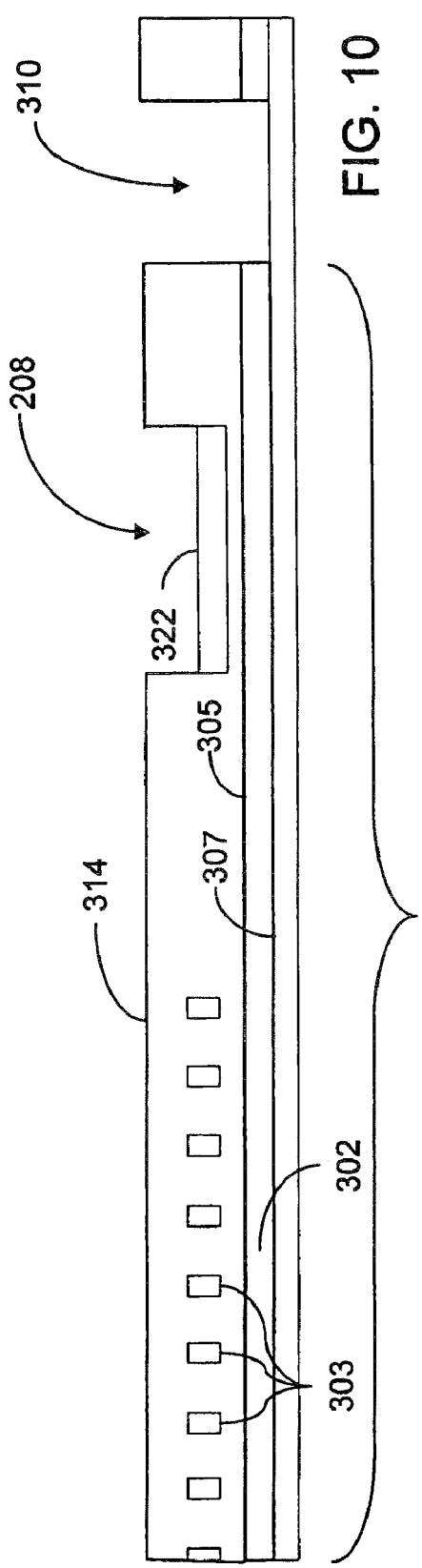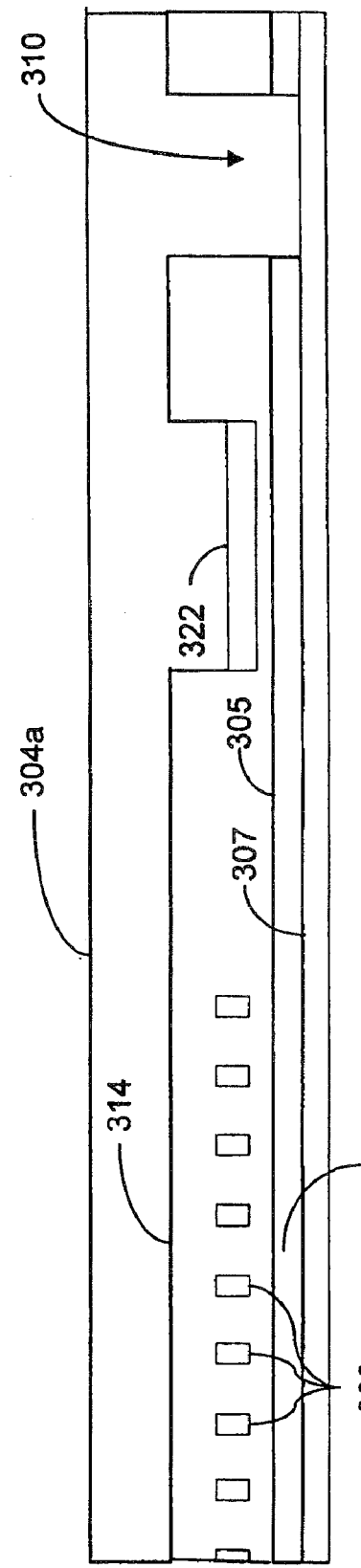

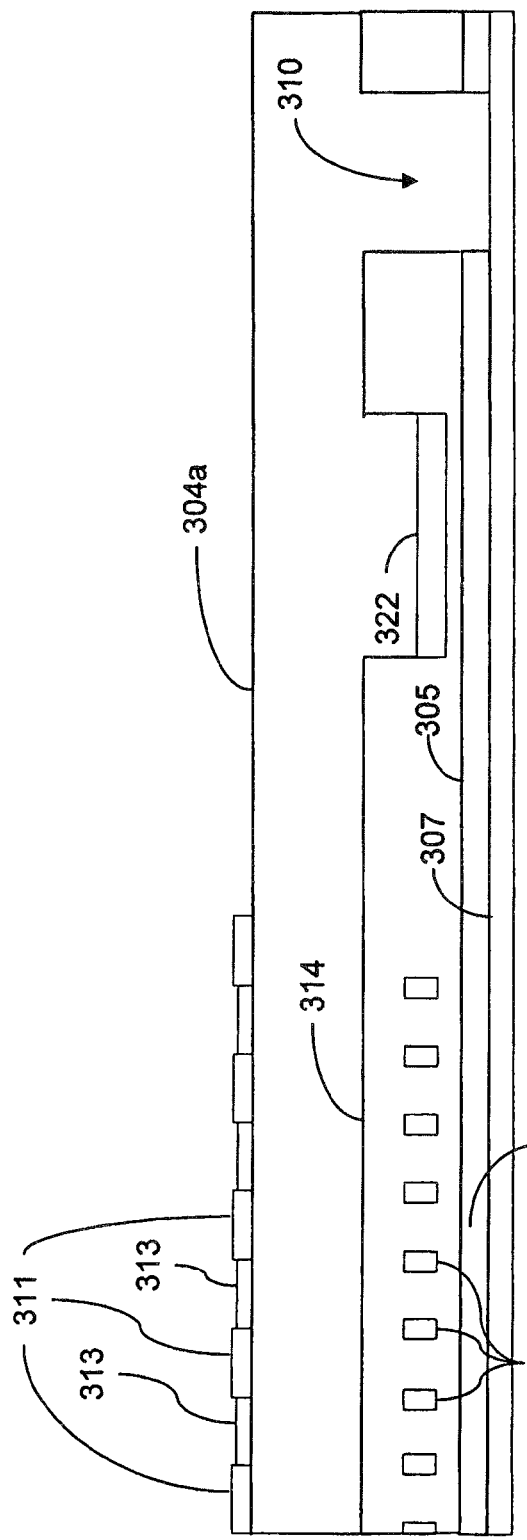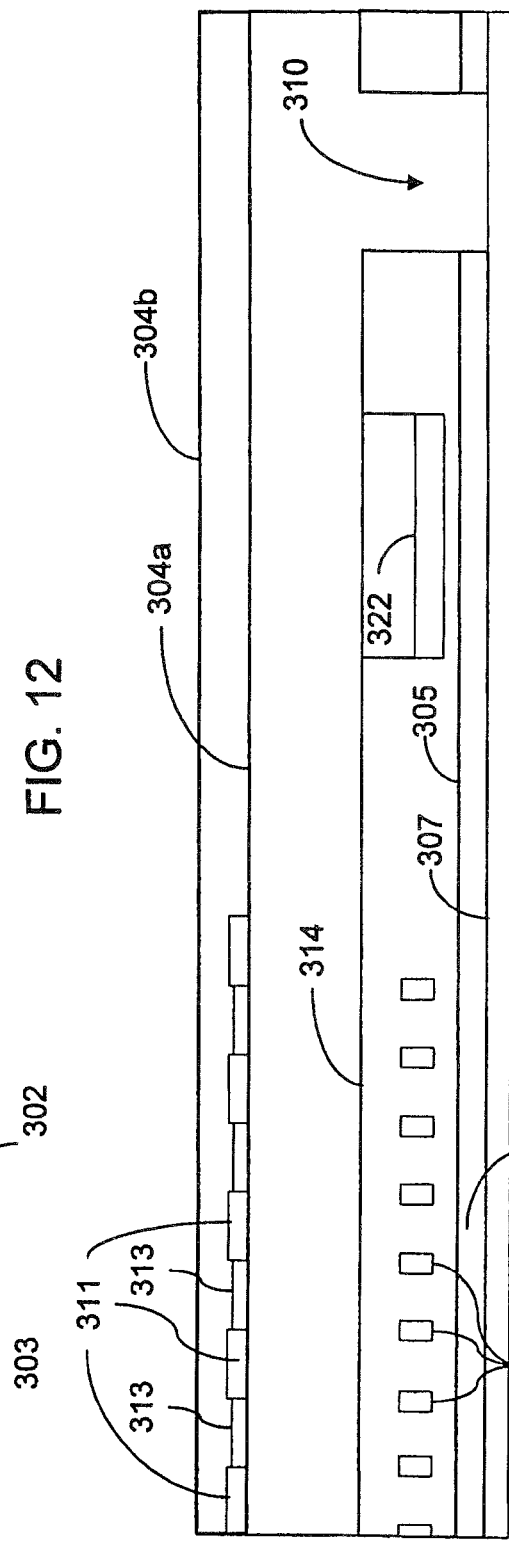

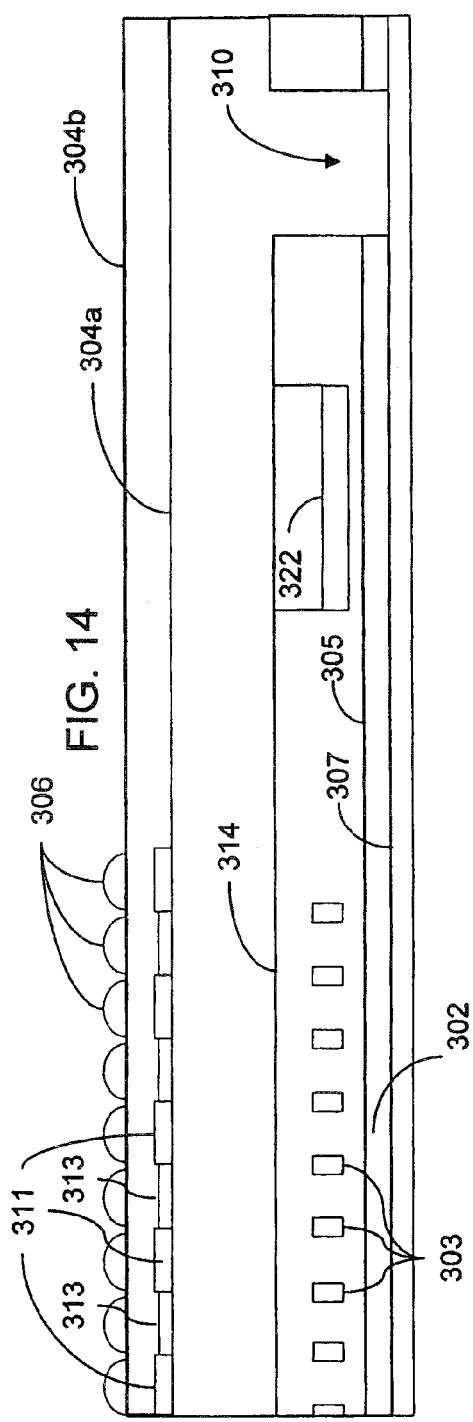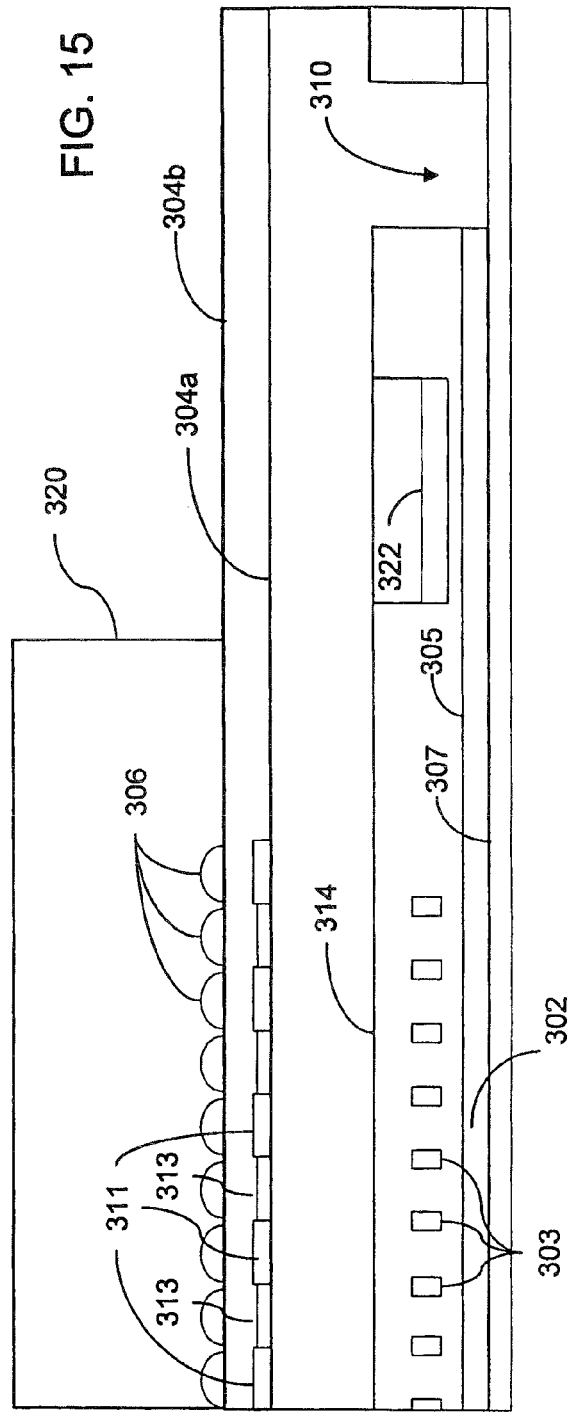

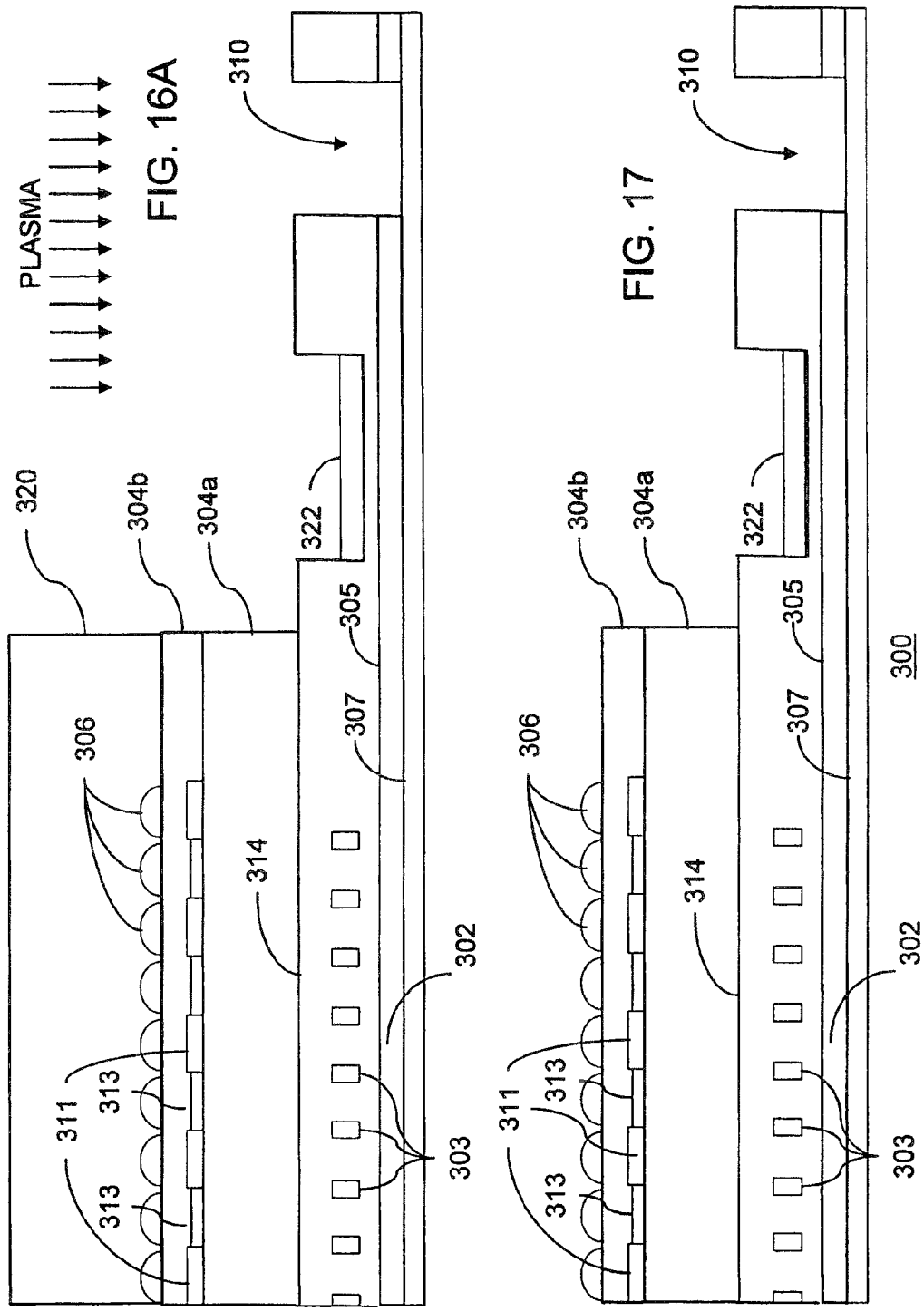

IMAGE SENSOR

CROSS-REFERENCE TO RELATED APPLICATIONS

This application is a divisional of U.S. patent application Ser. No. 11/156,794, filed Jun. 20, 2005, which is a continuation-in-part of U.S. patent application Ser. No. 10/781,217, filed Feb. 17, 2004, now U.S. Pat. No. 6,964,916, which is a continuation-in-part of U.S. patent application Ser. No. 10/456,759, filed Jun. 6, 2003, now U.S. Pat. No. 6,956,253 the entirety of which applications and patents are hereby incorporated by reference.

FIELD OF THE INVENTION

The present invention relates to semiconductor devices generally, and more specifically to solid-state color filters.

BACKGROUND

Color filters suitable for use in color image sensors have been described in U.S. Pat. Nos. 6,171,885, 6,395,576, 6,274,917, 6,482,669 and 6,495,813, all of which are incorporated by reference herein in their entireties.

A color image sensor is typically a charge-coupled device (CCD) or complementary metal-oxide semiconductor (CMOS) photodiode array structure. The structure includes a spectrally photosensitive layer below one or more layers patterned in an array of color filters, above which resides a surface-layer array of microlens elements. In some conventional configurations, a color pixel is formed using four adjacent pixels on an image sensor. Each of the four pixels is covered by a different color filter selected from the group of red, blue and two green pixels, thereby exposing each monochromatic pixel to only one of the three basic colors. Simple algorithms are subsequently applied to merge the inputs from the three monochromatic pixels to form one full color pixel.

FIGS. 1A and 1B show color filters having the "stripe defect." The stripe defect occurs when one of the color resist layers is thicker or thinner than the nominal value. In FIG. 1A, the stripe defect is due to a difference between the thicknesses of the blue and green resist. The sensor 100 includes a plurality of scribe lines 120 arranged in a rectangular array. A plurality of filter regions are surrounded by the scribe lines 120. The filter regions include active regions 110 and bond pad regions 130 arranged within the scribe lines 120. The stripe defect is indicated by the plurality of regions, designated "B", in which either the blue resist layer is thicker than its nominal value, or the green resist layer is thinner than its nominal value, and a plurality of regions designated "G" in which either the green resist layer is thicker than its nominal value, or the blue resist layer is thinner than its nominal value. Similarly, in FIG. 1B, the defect is due to a difference between the thicknesses of the green and red resist. In FIG. 1B, active regions are 110', bond pad regions are 130' and scribe lines are 120'. In regions designated "G", either the green resist layer is thicker than its nominal value, or the red resist layer is thinner than its nominal value. In regions designated "R", either the red resist layer is thicker than its nominal value, or the green resist layer is thinner than its nominal value.

FIG. 1D is a plan view of a bond pad exhibiting staining, which has also been observed when the bond pad is exposed to the color filter developing process. Such staining may indicate the presence of silicon oxide, organic residues, sodium, aluminium, fluorine and/or chlorine. Such staining is also associated with yield problems.

FIG. 1C is a side cross sectional view of a conventional CMOS imaging sensor (CIS) 100. The CIS 100 has a substrate 107 having a plurality of scribe lines 120 arranged to form at least one filter region 101 surrounded by the scribe lines. The substrate 107 may be an insulating substrate, or an insulating layer (e.g., $SiO_2$) above a semiconductor substrate. In a wafer having many filter regions 101, the plurality of scribe lines 120 form a grid of perpendicular lines. The filter region 101 includes an active region 102 and a bond pad region 108 with bond pads 122 thereon. The active region 102 may have n− or p+ well photo diodes therein, and may be, for example polycrystalline silicon. Active region 102 has a passivation layer 114 (e.g., SiN) thereon. The passivation layer 114 has a plurality of top metal regions 103. The passivation layer 114 has a planarization layer 104a formed thereon, which may be a resist layer thicker than the height of the steps on the wafer surface. Planarization layer 104a can be cast on the wafer and can be planarized by, for example, a free viscous flow of the resist at an elevated baking temperature or by a forced resist flow through pressing a flat mold on the resist surface while heating. Above the first planarization layer 104a, blue, green and red color resist layers are formed, designated 111 and 113. A second planar layer 104b is above the filters 111 and 113. A microlens layer 106 is formed above the second planar layer 104b.

The height 119 of layer 104b relative to the top of the passivation layer 114 may be about 4.5 µm. There is an additional height 118 of about 1.5 µm to 2 µm between the top of bond pad 122 and the top of the passivation layer 114, so the total step height between the top of passivation layer 114 and the top of the bond pad 122 is about 6 µm to 6.5 µm.

If the color filter signal deviation is too large, CMOS image sensor performance may be affected, resulting in yield loss as high as 15 to 20%. For example, the inventors of this application are aware of product samples in which the observed color signal standard deviations were: blue 3.93%, green 2.84% and red 1.68%. This corresponds to a yield measure Cpk of lower than 0.5.

The color filter deposition process and its relationship to the microlens array formation process are known to influence the production cycle-time, test-time, yield, and ultimate manufacturing cost.

A method of making a color filter with less signal deviation and improved yield is desired.

SUMMARY OF THE INVENTION

Some embodiments include a method for processing a substrate. The substrate has at least one filter region, a plurality of bond pads, and a plurality of scribe lines arranged around the filter region and bond pads. A first planarization layer is formed above the substrate. The planarization layer has a substantially flat top surface overlying the filter region, the bond pads and the scribe lines. At least one color resist layer is formed over the first planarization layer and within the filter region while the first planarization layer covers the bond pads and the scribe lines.

In some embodiments, a substrate has a filter region, a plurality of bond pads and a plurality of scribe lines arranged around the filter region and bond pads. The substrate has a planarization layer. The planarization layer has a substantially flat top surface overlying the filter region, the bond pads and the scribe lines. The substrate has at least one color resist layer formed over the planarization layer within the at least one filter region.

BRIEF DESCRIPTION OF THE DRAWINGS

FIGS. 6 to 9 show another exemplary embodiment of a method for fabricating a color image sensor.

FIGS. 10 to 17 show another exemplary embodiment of a method for fabricating a color image sensor.

DETAILED DESCRIPTION

Figure 1A:
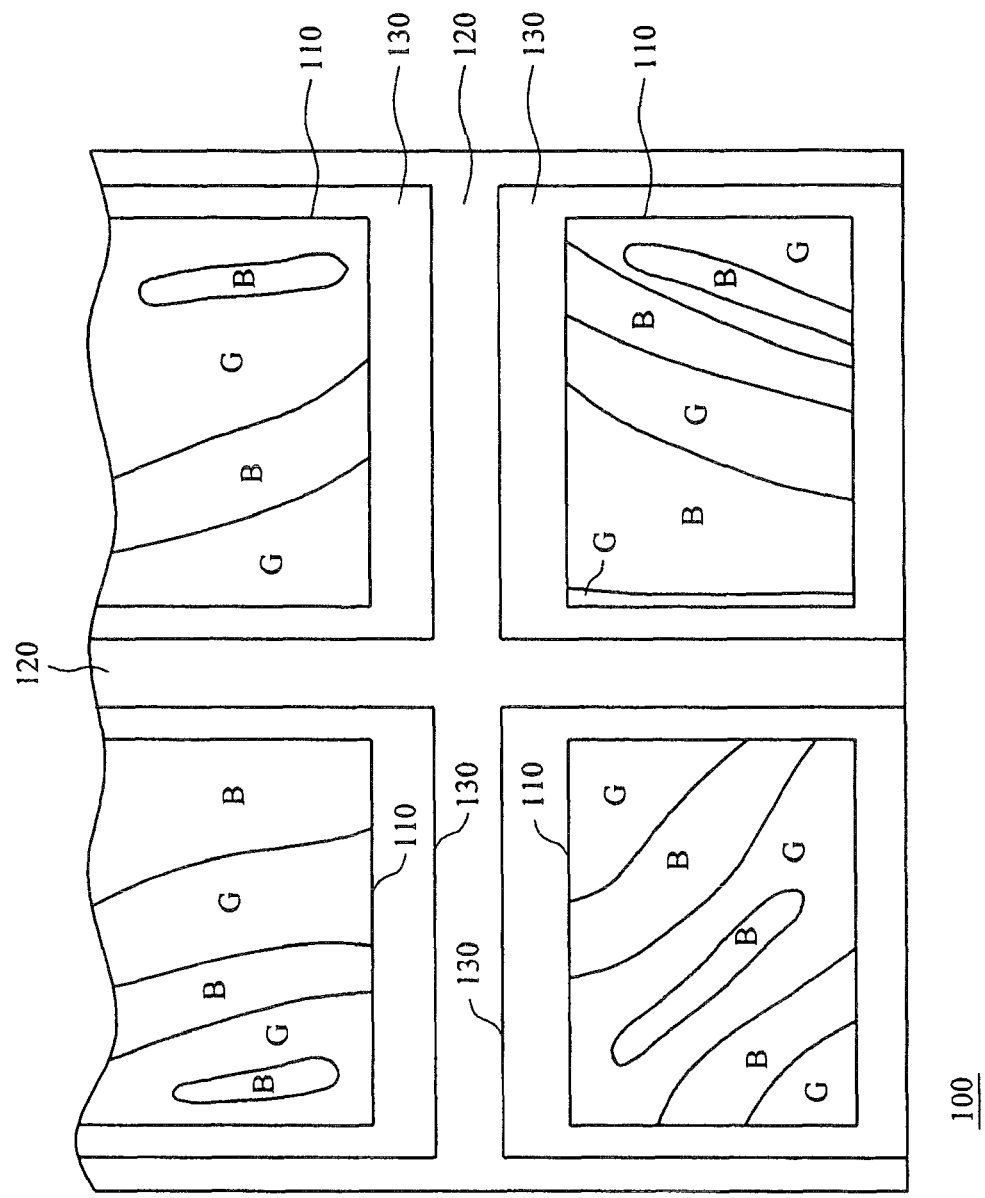
FIGS. 1A and 1B are plan views showing a plurality of color filter active regions that exhibit the stripe defect.
Figure 1B:
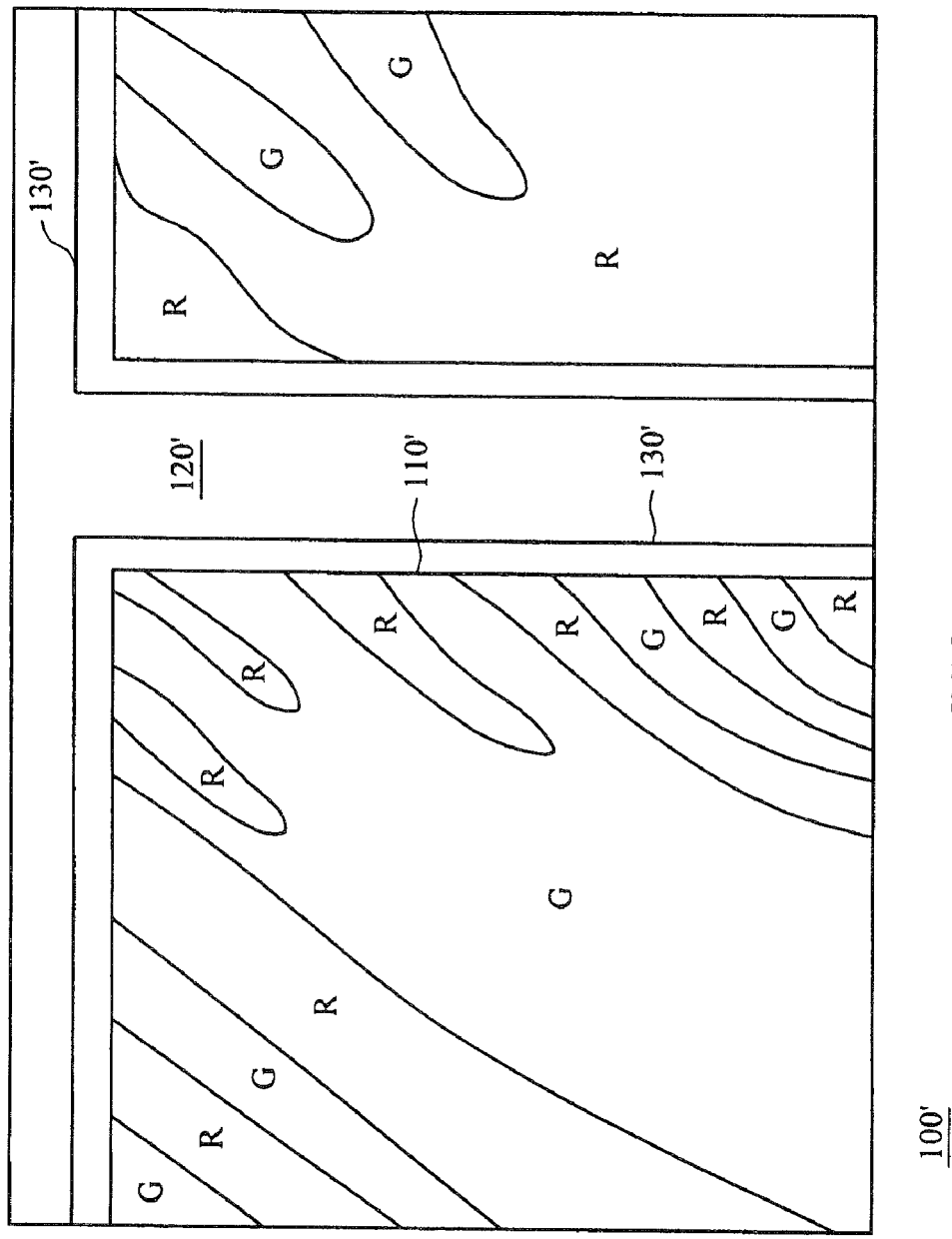

U.S. patent application Ser. Nos. 10/456,759, filed Jun. 6, 2003, and Ser. No. 10/781,217, filed Feb. 17, 2004, are incorporated by reference in their entireties, as though set forth fully herein.

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. In the drawings, like reference numerals indicate like components or items.

The inventors have determined that a major factor in causing color signal deviation in color filters is a problem referred to herein as the "stripe defect." The stripe defect refers to a condition in which the thickness of the color resist layers is not uniform within and/or between pixels. This is especially a problem with blue and green color resist layers. When the active region is viewed from above, these non-uniform color resist layers appear to have blue and green stripes or irregular regions.

The inventors have determined that the stripe defect is caused by serious front end topography issues. That is, the front end of the processing flow leaves an uneven surface on the semiconductor substrate on which the color filters are formed. This uneven surface degrades the ability to deposit planar layers above it.

The inventors have further determined that the deeper the step height of the scribe lines in the substrate, the more serious the stripe defect becomes. A secondary factor is the step height of the bond pad. Additional factors include the photoresist coating speed; higher coating speeds increase the stripe defect. However, the scribe line step height is the major cause of the stripe defect, and the bond pad step height is the next most significant factor.

Figure 2:
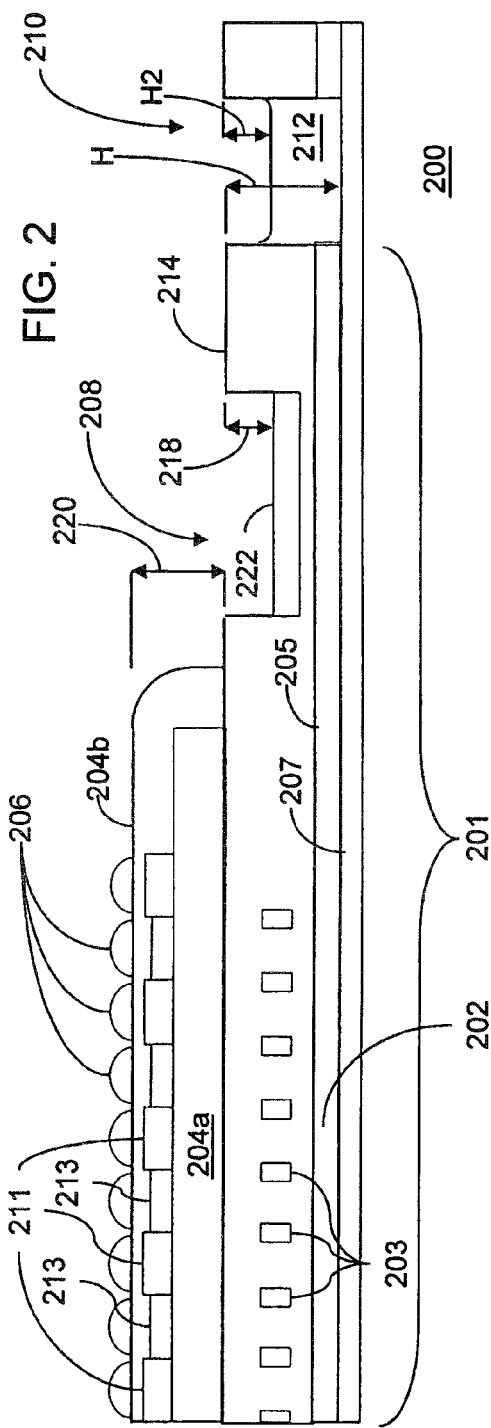
FIG. 2 is a cross sectional view showing an active region of a color image sensor formed using an exemplary method.

FIG. 2 is a cross-sectional view of an exemplary color filter device 200. The device 200 has a substrate having a plurality of scribe lines 210 arranged to form at least one filter region 201 surrounded by the scribe lines 210. The substrate 207 may be an insulating substrate, or an insulating layer (e.g., $SiO_2$) above a semiconductor substrate. In a wafer having many filter regions 201, the plurality of scribe lines 210 form a grid of perpendicular lines. The filter region 201 includes an active region 202 and a bond pad region 208 with bond pads 222 thereon. The active region 202 may have n− or p+ well photo diodes therein, and may be, for example polycrystalline silicon. The active region 202 has a passivation layer 214 (e.g., SiN) thereon. The passivation layer 214 has a plurality of top metal regions 203. The passivation layer 214 has a planarization layer 204a formed thereon, which may be a resist layer thicker than the height of the steps on the wafer surface. Preferably, planarization layer 204a is formed of a photoresist having high sensitivity and transmittance. Planarization layer 204a can be cast on the wafer and can be planarized by, for example, a free viscous flow of the resist at an elevated baking temperature or by a forced resist flow through pressing a flat mold on the resist surface while heating.

Above the first planarization layer 204a, blue, green and red color resist layers are formed, designated 211 and 213. The red color resist is not shown in FIG. 2, due to the arrangement of the red, green and blue color resist, but one of ordinary skill understands that when viewed from above, the color resist is arranged with groups of four green resist elements arranged in diamond configurations, with either a red or a blue resist element at the center of each diamond. Another sectional view (not shown) through the same device would show only green and red resist elements. A second planar layer 204b is above the filters 211 and 213. A microlens layer 206 is formed above the second planar layer 204b.

The scribe lines 210 initially have a step height H. The step height H depends on the type of integrated circuit (IC) technology. For example, a 0.6 µm CMOS image sensor has a scribe line step height H of 3.33 µm. A 0.35 µm CMOS image sensor has a scribe line step height H of 4.55 µm. A 0.25 µm CMOS image sensor has a scribe line step height H deeper than 4.55 µm. Other IC technologies will have corresponding step heights H which may differ from these.

In the exemplary embodiments, the step of depositing the planarization layer 204a is modified to include at least partially filling the scribe lines 210 with a resist material 212 to reduce the step height of the scribe lines to H2 (where the step height H2 after the partial filling is the distance between the surface of the resist and the surface of the substrate). By at least partially filling the scribe line with resist, the uneven topography is reduced or eliminated, allowing uniform formation of the color resist layers 211 and 213.

In FIG. 2, the resist 212 is only deposited inside the scribe line 210 to partially fill the scribe line 210. In some embodiments, the at least partial filling of the scribe line with resist is completed with the top of the resist below the surface of the substrate (i.e., with a positive step height remaining). In other embodiments, the scribe line 210 is completely filled, as described further below.

Figure 3:
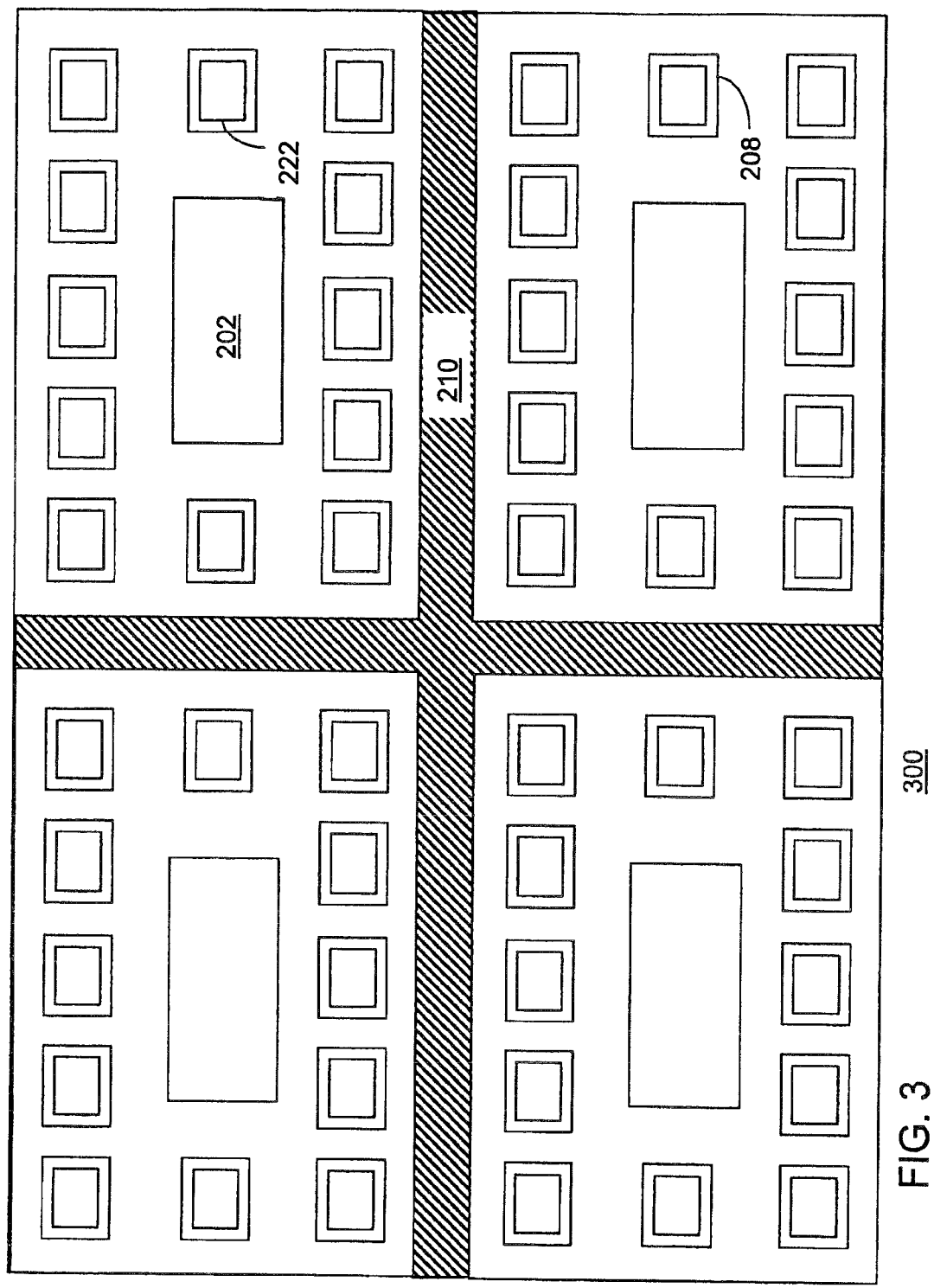
FIG. 3 is a plan view of a mask over the substrate shown in FIG. 2.

FIG. 3 shows an example of a mask 400a that can be used to deposit the resist 212 in FIG. 2. In some embodiments, the mask is clear in the scribe lines 210 and dark outside of the scribe lines (for a negative resist). The resist in the scribe line regions becomes insoluble (hardened) upon exposure to the radiation, and the resist outside of the scribe lines remains soluble, for removal.

In other embodiments, the mask pattern is reversed, and the mask causes a positive photoresist outside the scribe line region to become soluble, in order keep resist in the scribe line 210 only. The mask is clear outside of the scribe lines and dark inside the scribe lines (for a positive resist). The resist inside the scribe lines remains insoluble and is kept.

In some embodiments, a chemical solution is applied to dissolve and remove the soluble portion of the resist outside the scribe lines 210. In other embodiments, dry plasma etch is used, where ions energized by a plasma field hit the portion of resist layer outside the scribe lines 210 and chemically dissolve it. The resist 212 remains in the scribe lines 210.

Figure 4:
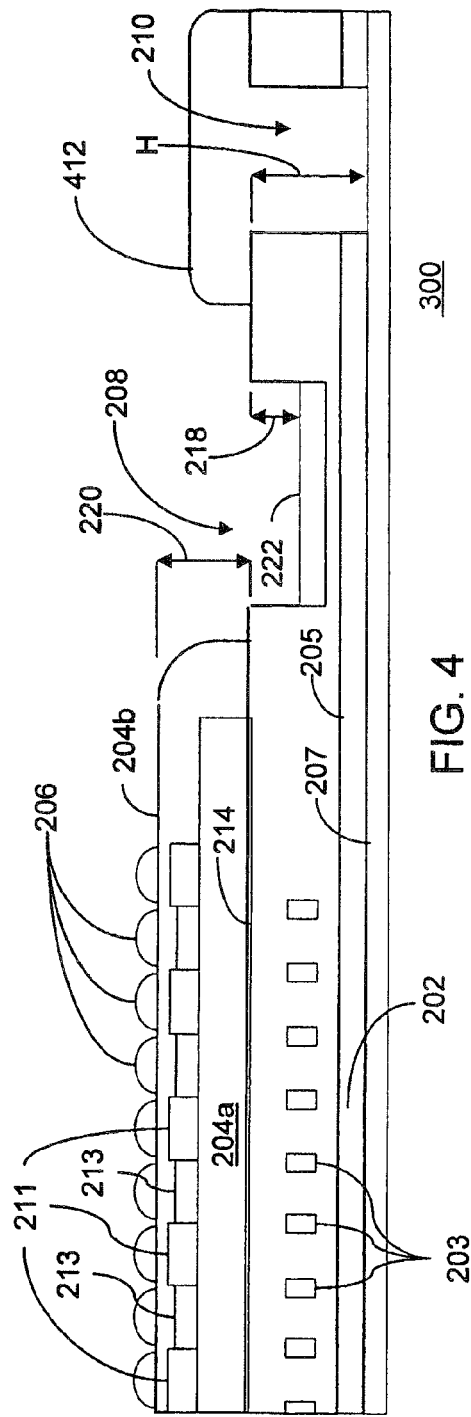
FIG. 4 is a cross sectional view showing an active region of a color image sensor formed processed using a different mask.

FIG. 4 is another example of a color filter 300, in which the resist 412 completely fills the scribe line, and continues above the substrate to about the height of the planarization layer 204a. In FIG. 4, the resist 412 is deposited all across the substrate, except in the immediate vicinity of the bond pads 222. This allows a greater degree of planarization, and is believed to promote formation of color resist layers 211 and 213 with more uniform thickness.

Figure 5:
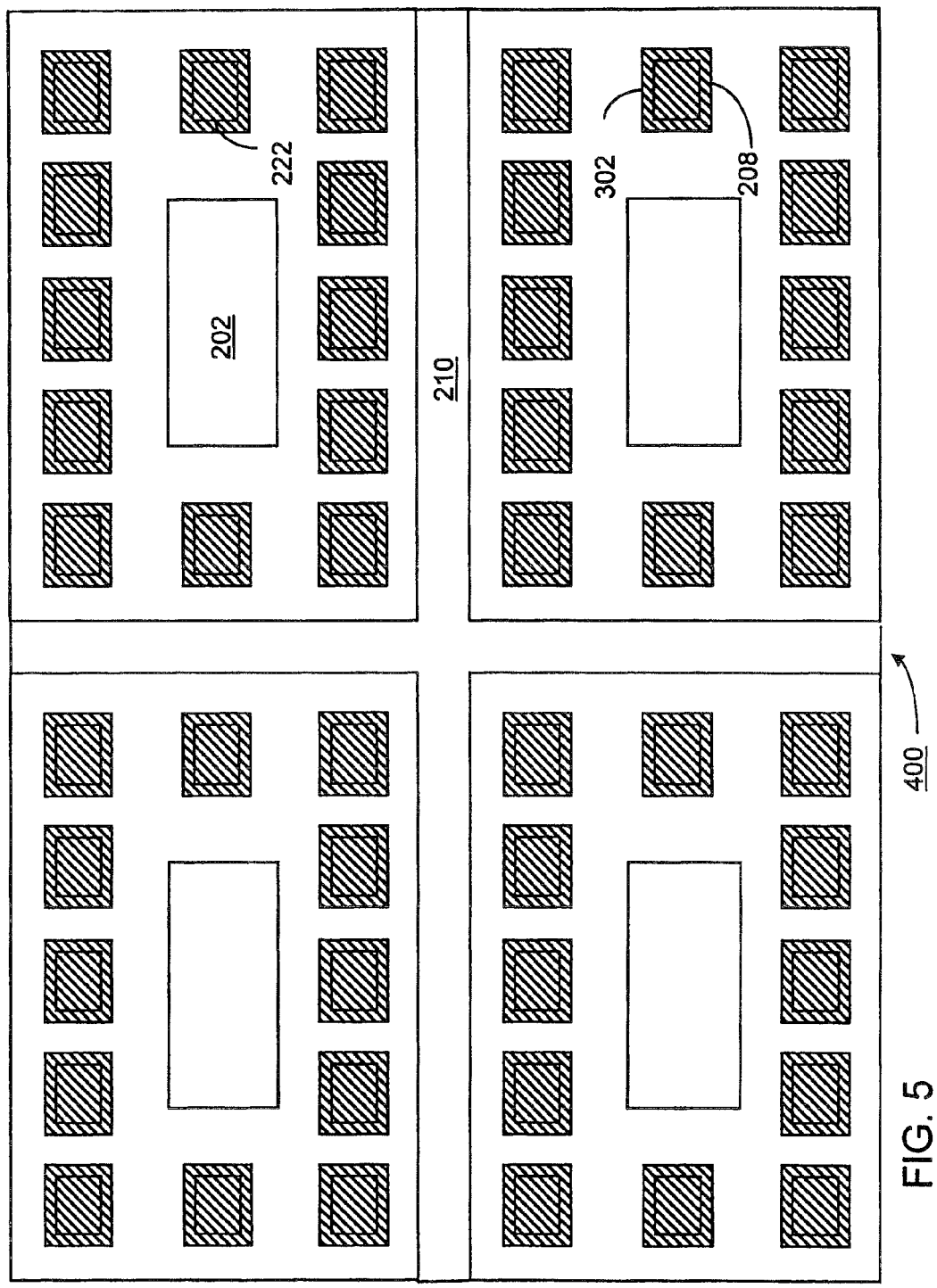
FIG. 5 is a plan view of a mask used to deposit resist on the color image sensor shown in FIG. 4.

FIG. 5 shows a mask 400b that can be used to perform the photoresist deposition step for depositing the resist 412 of FIG. 4. The exemplary mask 400b is clear throughout (assuming a negative resist is used), except within the square regions 302, which overlie the bond pad regions 208 and surround the bond pads 222. The mask is dark in regions 302. As a result, when the substrate is exposed through the mask 400b, the resist is exposed everywhere except in the bond pad regions 208. After exposure, the portion of resist layer outside of the bond pad regions 208 becomes insoluble. The soluble portion of the resist in the bond pad regions 208 is removed using, for example, a chemical solution or dry plasma etch as described above, and the resist 412 remains in the scribe lines 210.

In other embodiments, (where a positive resist is used) the mask pattern is reversed, so that only the bond pad regions are exposed, and the exposed portion of resist layer becomes soluble. The portions of the resist outside the bond pad regions (including the resist in the scribe lines) remains insoluble.

The resist material 212, 412 may include any energy-sensitive material that can be formed on a substrate to create a pattern during integrated circuit manufacturing. Resist material 212 may contain, among many other ingredients, energy-sensitive polymers which change from soluble to insoluble after exposure to an energy source for a negative resist; and vice versa for positive resist. Resist material generally is tailored to a specific exposure source. In some embodiments, 248 nm resist material for deep ultraviolet (UV) at 248 nm or 193 nm resist material for deep ultraviolet (DUV) at 193 nm is employed. These are only examples, and other resists (including UV, DUV, X-ray and e-beam resists) may be used.

In some embodiments, the resist 412 is planarized, using a process such as etching. In some embodiments, the steps of applying the resist 412 and etching back the resist (to planarize the resist) are repeated a plurality of times, until a desired degree of planarization is achieved, and the step height in the scribe line is reduced to a desired amount.

In some embodiments, a mask such as that shown in FIG. 3 is used through one or more iterations to deposit photoresist in the scribe lines, followed by deposition using a mask such as that shown in FIG. 5 to deposit the resist above the surface of the substrate 207.

After the resist material 412 is deposited, a regular planarization mask (not shown) may be used to deposit photoresist on the active region 202 within the filter region, to form the planarization layer 204a. At least one color resist layer 211, 213 is formed above the substrate within the at least one filter region while the hardened (insoluble) resist material remains in the scribe lines. Then the second planarization layer 204b is formed, and the microlens layer 206 is formed.

Once the resist 412 is deposited in the scribe line 210, the resist can be kept in the scribe lines permanently (i.e., until dicing). The resist 412 may optionally be removed from the scribe lines, if desired.

In an experiment, a 0.35 µm CMOS image sensor was formed. Prior to depositing the resist 412, the scribe line step height was 4.55 µm. After depositing a first layer of the resist using the mask shown in FIG. 5, the step height (i.e., the distance from the top of the resist to the top of the substrate) was reduced to 2.6 µm, a 43% reduction. After depositing a second layer of resist using the same mask, the step height was reduced to 0.6 µm. This represents an 87% reduction in the step height. The experiment showed that the yield (as measured by Cpk) greatly improved. Table 1 provides the results in terms of color non-uniformity. In Table 1, the 001A mask refers to a conventional mask used to form a planarization layer 204a in the active region. The 001B mask refers to the mask shown in FIG. 5. Thus, the columns designated "1X 001A mask only" refers to a conventional process. The mean and standard deviation refer to the color filter signal deviations.

TABLE 1

| | 1X 001A mask only | | | 1X 001B mask combined with 001A | | | 2X 001B mask combined with 001A | | |
|---|---|---|---|---|---|---|---|---|---|
| Color | Mean | Std dev. | Cpk | Mean | Std dev. | Cpk | Mean | Std dev. | Cpk |
| Blue | 8.49% | 3.93% | −0.08 | 5.16% | 0.93% | 0.84% | 4.38% | 0.53% | 1.96 |
| Green | 6.45% | 2.84% | 0.12 | X | X | X | 4.13% | 0.45% | 2.5 |
| Red | 5.32% | 1.68% | 0.43 | X | X | X | 4.34% | 0.51% | 2.07 |

In Table 1, the columns designated, "1X 001B mask combined with 001A," refers to a process in which the mask 001B shown in FIG. 5 is used to deposit one layer of resist in the scribe lines (partially filling the scribe line), followed by deposition of the planarization layer 204a on the active region 202. The columns designated, "2X 001B mask combined with 001A," refers to a process in which the mask 001B shown in FIG. 5 is used to deposit two layers of resist in the scribe lines (partially filling the scribe line), followed by deposition of the planarization layer 204a on the active region 202. As a reference, a Cpk value of 0.5 corresponds to a yield of about 85%, and a Cpk value of 1.9 corresponds to a yield value near 100%.

Thus, by partially or completely filling the scribe line with resist before forming the color filter layer 211, 213, a more planar surface is provided, enhancing the uniformity of the subsequently formed color filter layers.

Although an example is describe above in which two depositions of resist are used, any desired number of resist depositions may be used, depending on the depth of the scribe lines.

FIG. 9 is a cross sectional view showing another exemplary embodiment, in which the step height of the bond pad 222 is reduced, in addition to reducing the step height of the scribe line. Fabrication of the CIS is shown in FIGS. 6-9.

Figure 6:
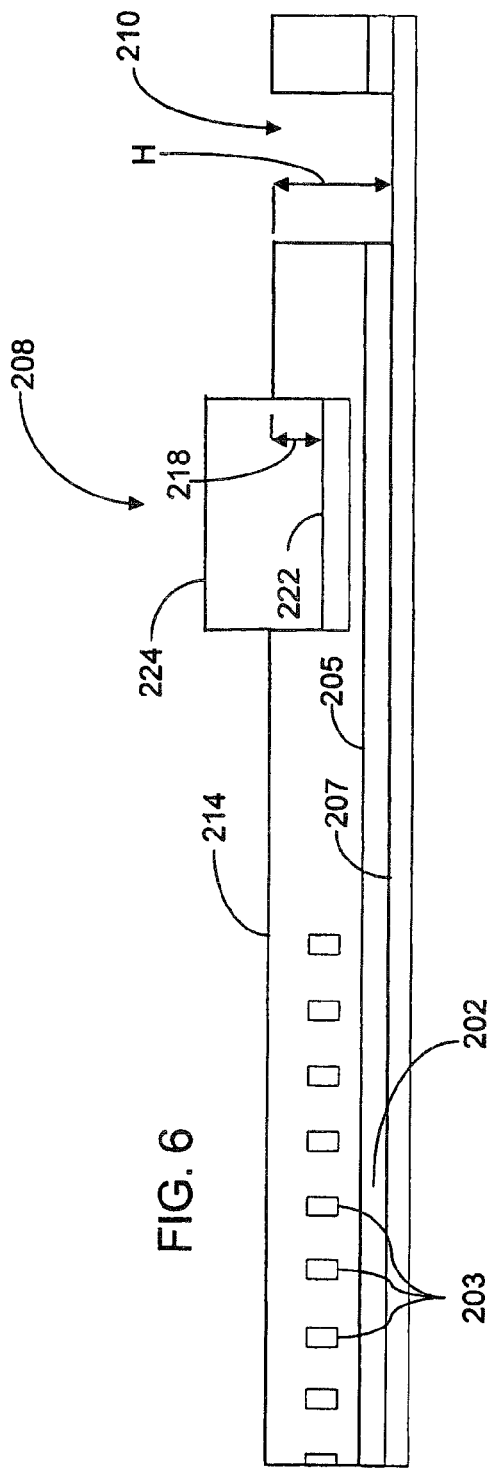

Referring first to FIG. 6, fabrication of the CIS begins with formation of the insulation layer 207, deposition and doping of the semiconductor (e.g., polycrystalline silicon) layer 205, deposition of the bottom passivation layer 214, and deposition of the layer for top metal 203 and bond pad 222, which may be aluminum/copper, for example. The top passivation layer 214 is then deposited and etched, to expose the bond pad 222. The step height 218 between the top of the bond pad 222 and the top of the passivation layer 214 may be about 1.5 µm to 2 µm at this point. As noted above, when the planarization layers 204a and 204b are added, the step height could grow to between about 6 µm and 6.5 µm, if no action is taken to reduce the step height.

As shown in FIG. 6, an added step includes depositing a post-passivation pad portion 224 on top of the bond pad 222, to form a bond pad structure (including bond pad 222 and portion 224) having a height greater than the height of the bond pad, and having a step height less than that of the bond pad. The post-passivation pad portion 224 is formed of the same material as the bond pad 222, using a process such as sputtering, a lithographic process, or photoresist etching (stripping). The thickness of the post-passivation pad portion 224 may be from about 1.5 µm to about 6.0 µm, depending on the step height to be reduced or eliminated.

Figure 7:
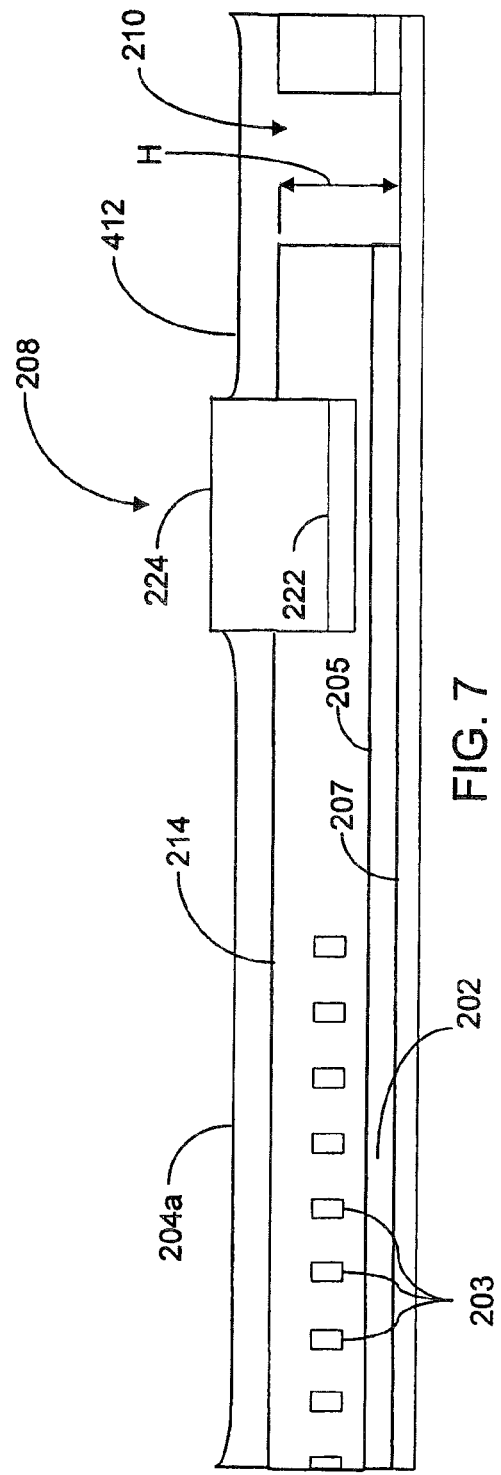

FIG. 7 shows the structure of FIG. 6, after a planarization layer 204a is deposited. Preferably, planarization layer 204a has high sensitivity and transmittance. In some embodiments, the material (e.g., photoresist) of planarization layer 204a fills the scribe line 210, in the manner described above with reference to FIG. 4, as indicated by reference numeral 412. Preferably, the material 412 remains in the scribe line until the dicing step. In the embodiment of FIG. 7, only the post-passivation pad portion 224 is exposed.

Preferably, the top of the post-passivation pad portion 224 is (exactly or) approximately as high as the top of the planarization layer 204a (resulting in approximately zero step height between the pad portion 224 and the planarization layer 204a). Some improvement in yield can be obtained with a smaller height for post-passivation pad portion 224 (resulting in a reduced, but non-zero step height), but the improvement is greater with the height of the post-passivation pad portion 224 approximately as high as the top of the planarization layer 204a. In FIG. 7, the post-passivation pad portion 224 is slightly higher than the top of the planarization layer 204a. The resulting structure shown in FIG. 7 has a planar topography, which is advantageous for reducing the stripe defect in the color photoresist layers 211, 213.

Figure 1C:
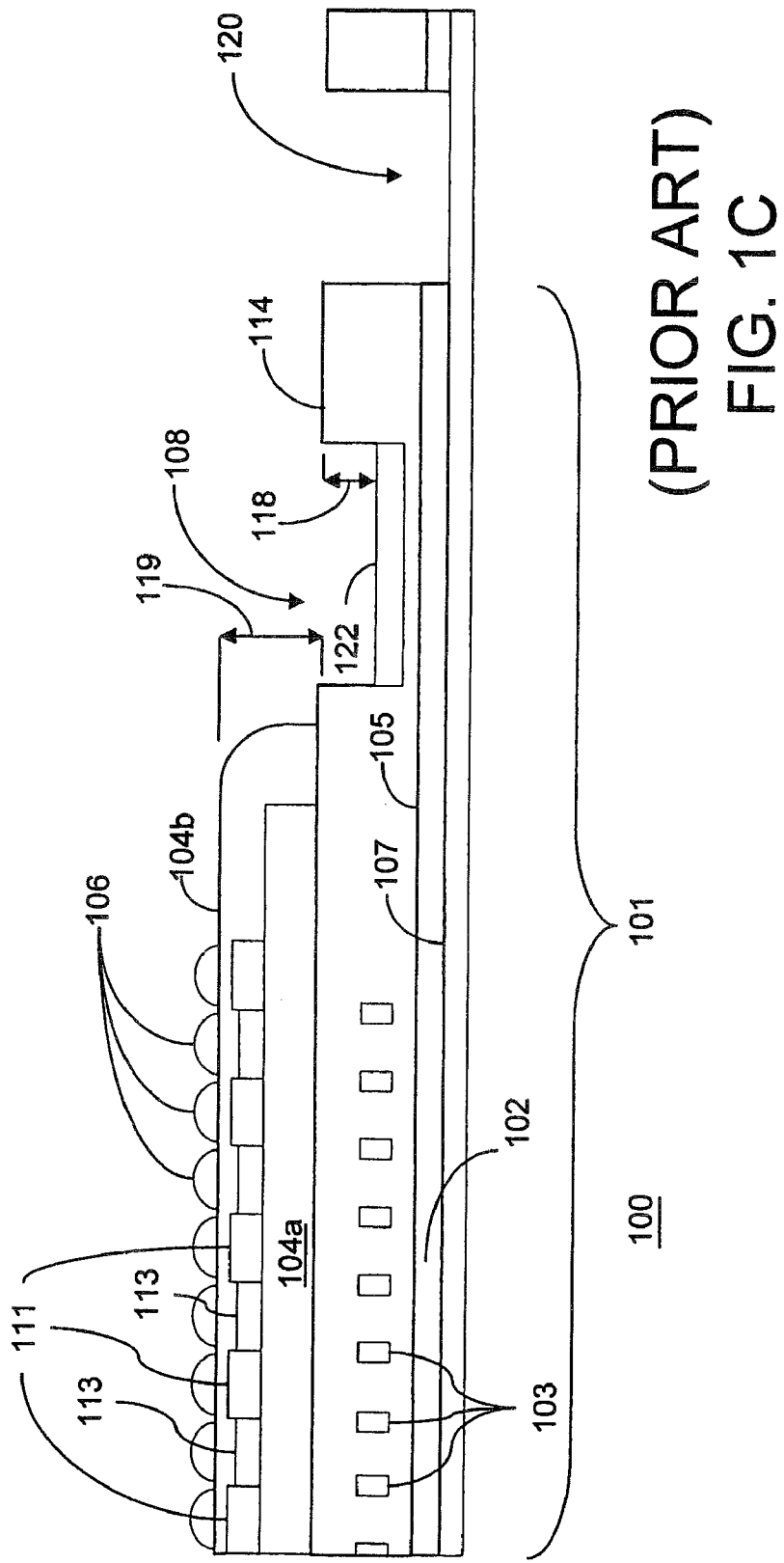
FIG. 1C is a cross sectional view showing a conventional color image sensor.

In other embodiments (not shown), the post-passivation pad portion 224 is provided, and the planarization layer 204a above the active region 202 has approximately zero step height relative to pad portion 224, but the scribe line 210 is not filled with the planarization material. Although such embodiments provide a yield improvement relative to the prior art structure of FIG. 1C, the yield improvement is greater when the material 412 also fills the scribe line as shown in FIG. 7.

FIG. 8 shows the steps of forming the color filter layers 211, 213 and the spacer layer 204b. The spacer layer 204b is formed of the same material as the planarization layer 204a, and completely covers the color filter layer(s) 211, 213. In preferred embodiments, the spacer layer 204b also covers the scribe line, so that only the post-passivation pad portion 224 is exposed. The resulting configuration shown in FIG. 8 has a planar top surface, which is advantageous for reducing the stripe defect in the microlenses 206. The step height between the top of spacer 204b and the post-passivation pad portion 224 is substantially less than the sum of height 118 and height 119 between top of spacer 104b and the bond pad 122 (4.5 µm+[1.5 µm to 2 µm]=6 µm to 6.5 µm) shown in FIG. 1C.

FIG. 9 show the configuration after formation of the microlenses 206. Following formation of the microlenses, heat is applied and the microlens material is reflowed.

Figure 1E:
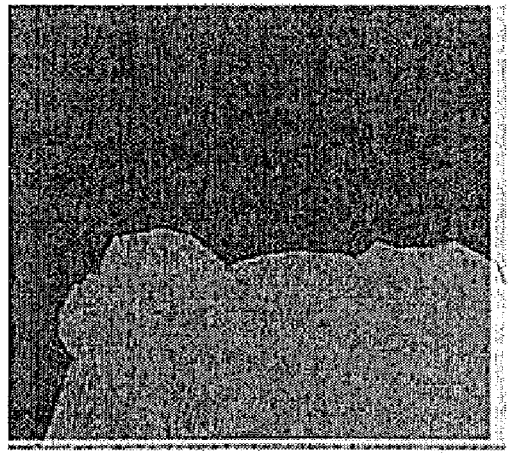
FIG. 1E is a plan view showing a photoresist peel effect.

When providing photoresist in the scribe lines to prevent striping (as described above with reference to FIG. 2), if the photoresist is left in the scribe line, photoresist peeling may occur after die sawing. FIG. 1E shows an example of such photoresist peeling observed after dicing.

Figure 1D:
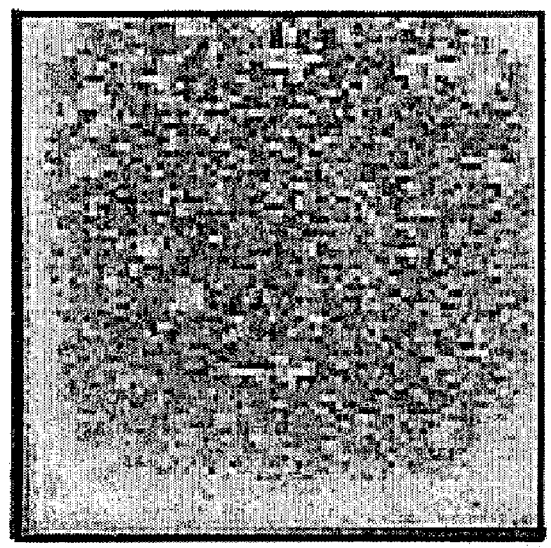
FIG. 1D is a plan view showing a bond pad exhibiting the staining effect.

FIGS. 10 to 17 show another embodiment of a method for eliminating the stripe defect, which also avoids the bond pad staining effect (FIG. 1D) and photoresist peeling (FIG. 1E). In this embodiment, a planarization layer 304a is formed above the substrate 307. The planarization layer 304a has a substantially flat top surface overlying the filter region 301, the bond pads 322 and the scribe lines 310. At least one color resist layer 311, 313 is formed over the planarization layer 304a while the planarization layer covers the bond pads 322 and the scribe lines 310. Planarization layer 304a reduces topographic effects. In some embodiments, the planarization layer 304a is used to keep the whole wafer totally flat throughout the whole color filter fabrication process, and then the bonding pads are opened after the end of the process.

Referring now to FIG. 10, a substrate 307 may be an insulator or an insulator layer on an underlying semiconductor material. A semiconductor layer 305 is formed on the substrate 307. The substrate 307 has a plurality of scribe lines 310 arranged to form at least one filter region 301 surrounded by the scribe lines 310. In a wafer having many filter regions 301, the plurality of scribe lines 310 corresponding to each filter region form a grid of perpendicular lines. The filter region 301 includes an active region 302 and a bond pad region 308 with bond pads 322. The active region 302 may have n– and/or p+ well photo diodes therein, and may be, for example polycrystalline silicon. The active region 302 has a passivation layer 314 (e.g., SiN) thereon. The passivation layer 314 has a plurality of top metal regions 303. The substrate 307 is cleaned in a scrubber.

FIG. 11 shows formation of a first planarization layer 304a above the substrate 307. The planarization layer 304a has a substantially flat top surface without patterning. The planarization layer 304a overlies the filter region 301, the bond pads 322 and the scribe lines 310. The thickness of the first planarization layer may be between 0 and about 2 µm. The thickness is determined based on front-end topography. The flatter the wafer surface, the thinner the planarization layer could be. The planarization layer may be applied in a coater machine, and may be formed of photo-resist or a non photo sensitive material covering the whole wafer surface. Suitable non-photosensitive materials may be chosen to provide high thermal endurance and high transmittance, Nevertheless, specific application of an anti-refractive coating film is an alternative solution. The first planarization layer 304a may be, for example, cast on the wafer and planarized by either a free viscous flow at an elevated baking temperature or by a forced flow using a flat mold while heating. Other methods of planarizing the layer 304a may also be used, such as etching or chemical mechanical polishing.

FIG. 12 shows formation of red, green and blue color resist layers 311, 313 over the first planarization layer 304a and within the filter region 301 while the first planarization layer 304a covers the bond pads 322 and the scribe lines 310. Formation of the resist layer 311, 313 in this manner avoids the stripe defect. The color resist layer(s) may be applied using coater, developer, and i-line stepper apparatus. At the conclusion of this step, the substrate 307 has a filter region 301, a plurality of bond pads 322 and a plurality of scribe lines 310 arranged around the filter region and bond pads, a planarization layer 304a having a substantially flat top surface overlying the filter region, the bond pads and the scribe lines, and at least one color resist layer 311, 313 formed over the planarization layer 304a within the at least one filter region 301.

FIG. 13 shows formation of a second planarization layer 304b over the first planarization layer 304a and the color resist layer 311, 313. The second planarization layer 304b has a planar top surface overlying the filter region 301, the bond pads 322 and the scribe lines 310. The second planarization layer 304b may be applied in a coater, and may be formed of photo-resist or a non photo sensitive material covering whole wafer surface. The total combined thickness of the first and second planarization layers 304a and 304b above the active region 302 may be, for example, from about 1 μm to about 5 μm. The second planization layer 304b may be, for example, cast on the wafer and planarized by either a free viscous flow at an elevated baking temperature or by a forced flow using a flat mold while heating. Other methods of planarizing the layer 304b may also be used, such as etching or chemical mechanical polishing.

FIG. 14 shows formation of microlens elements 306 in the filter region 301 over the second planarization layer 304b. The microlens elements 306 may be patterned using coater, developer and i-line stepper apparatus.

FIG. 15 shows formation and patterning of a microlens protection layer 320 on the color filter sensing area. The microlens protection layer 320 may comprise a photoresist, and may have a thickness of from about 4 μm to about 10 μm, for example. The microlens protection layer 320 may be applied and patterned using coater, developer, i-line stepper and asher apparatus. The microlens protection layer 320 may be patterned by high viscosity positive photo-resist developing with a Tetra-Methyl Ammonium Hydroxide (TMAH) based developer, for example. Alternatively, other procedures and developers may be used for patterning the microlens protection layer 320.

At the conclusion of this step, the substrate 307 has: a filter region 301, a plurality of bond pads 322 and a plurality of scribe lines 310 arranged around the filter region and bond pads, a planarization layer 304a having a substantially flat top surface overlying the filter region, the bond pads and the scribe lines, at least one color resist layer 311, 313 formed over the planarization layer 304a within the at least one filter region 301, a second planarization layer 304b over the color resist layer 311, 313 with a planar top surface overlying the filter region 301, the bond pads 322 and the scribe lines 310, a plurality of microlens elements 306 in the filter region 301 over the second planarization layer 304b, a microlens protective layer 320 over the microlens elements 306, and an identification mark 324 formed of a resist material above the substrate 307 in a region containing the bond pads 310.

Figure 16B:
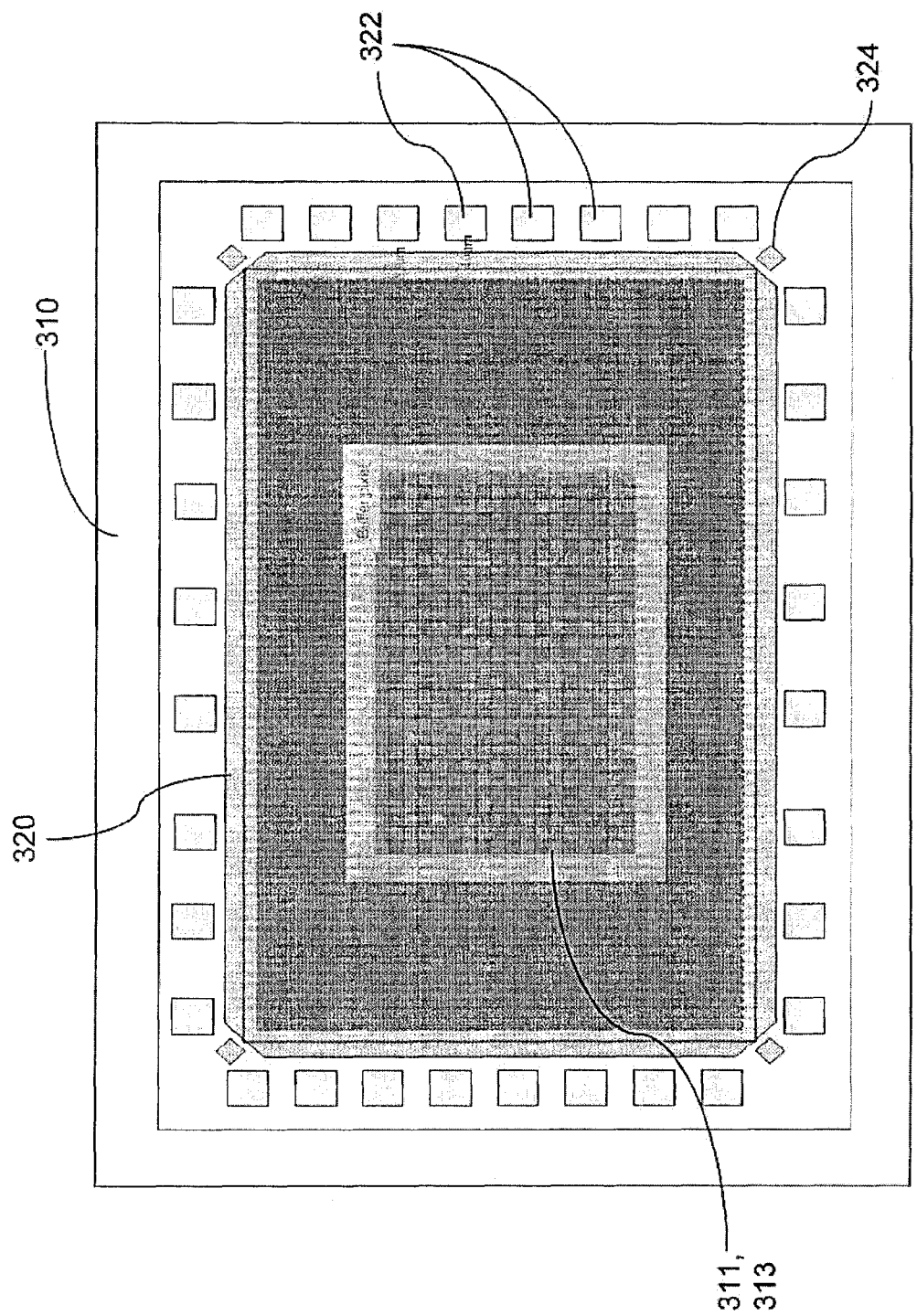

As best seen in FIG. 16B, the method may optionally include forming the identification mark 324 above the substrate 307 in a region containing the bond pads 322 while forming the microlens protective layer 320. The identification mark 324 may be formed with any shape, and may be located any where around the main pattern containing the sensing elements. This mark may be used subsequently to detect whether the microlens protective layer 320 is present or not.

FIG. 16A shows a step of removing the first and second planarization layers 304a and 304b from the bond pads 322 and from the scribe lines 310 after forming the color resist layer 311, 313 and the microlens elements 306. This may be accomplished by etching the first and second planarization layers 304a, 304b from the bond pads 322 and the scribe lines 310. For example, a dry etch process, such as an oxygen plasma etch, may be used to clear the microlens protection layer 320, except for the area over the sensing elements, which are protected by layer 320. After the etching step, the microlens protection layer 320 has a thickness of about 2μ to about 8 μm.

FIG. 17 shows the step of stripping the microlens protective layer 320, which may be accomplished by a spin/batch type stripper, for example. The CMOS imaging sensor 300 is now ready for cleaning in the cleaner.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A color filter device, comprising
a substrate comprising a filter region, a plurality of bond pads with openings over the bond pads, and a plurality of scribe lines arranged around the filter region and bond pads;
a planarization layer having a substantially flat top surface located so as to cover the filter region, the bond pads and the scribe lines, the planarization layer being a single layer shaped so as to fill the scribe lines and openings over the bond pads; and
at least one color resist layer formed over the planarization layer within the at least one filter region.

2. The color filter device of claim 1, further comprising a second planarization layer over the color resist layer, the second planarization layer having a planar top surface overlying the filter region, the bond pads and the scribe lines.

3. The color filter device of claim 2, further comprising a plurality of microlens elements in the filter region over the second planarization layer.

4. The color filter device of claim 3, further comprising a microlens protective layer over the microlens elements.

5. The color filter device of claim 3, wherein the microlens protective layer is formed from a photoresist.

6. The color filter device of claim 5, further comprising an identification mark formed of a resist material above the substrate in a region containing the bond pads, wherein the identification mark is formed from the same material as the microlens protective layer.

7. The color filter device of claim 2, wherein the first and second planarization layers are layers of non-photosensitive material.

8. A color filter device, comprising:
a substrate having at least one filter region, a plurality of bond pads with openings over the bond pads, and a plurality of scribe lines arranged around the filter region and bond pads;
a first planarization layer above the substrate, the first planarization layer being a single layer and having a substantially flat top surface located so as to cover the filter region, the bond pads and the scribe lines, the first planarization layer being shaped so as to fill the scribe lines and openings over the bond pads; and
at least one color resist layer over the first planarization layer and within the filter region.

9. The color filter device of claim 8, further comprising:
a second planarization layer over the first planarization layer and the color resist layer, the second planarization layer having a planar top surface overlying the filter region; and
microlens elements in the filter region over the second planarization layer.

10. The color filter device of claim 9, further comprising a microlens protective layer over the microlens elements.

11. The color filter device of claim 10, wherein the microlens protective layer is formed from a photoresist.

12. The color filter device of claim 11, further comprising an identification mark formed of a resist material above the substrate in a region containing the bond pads.

13. The color filter device of claim 12, wherein the identification mark is formed from the same material as the microlens protective layer, and the mark provides an indication of whether the microlens protective layer is present.

14. The color filter device of claim 9, wherein the first and second planarization layers are layers of non-photosensitive material.

15. A color filter device, comprising:
a substrate having at least one filter region, a plurality of bond pads with openings over the bond pads, and a plurality of scribe lines arranged around the filter region and bond pads;
a first planarization layer above the substrate, the first planarization layer located so as to cover the filter region, the first planarization layer being a single layer and having a substantially flat top surface overlying the filter region, the first planarization layer being shaped so as to fill the scribe lines and openings over the bond pads;
at least one color resist layer over the first planarization layer and within the filter region while the first planarization layer covers the bond pads and fills and covers the scribe lines;
forming a second planarization layer over the first planarization layer and the color resist layer, the second planarization layer having a planar top surface overlying the filter region;
microlens elements in the filter region over the second planarization layer; and
an identification mark of a resist material above the substrate in a region containing the bond pads.

16. The color filter device of claim 15, further comprising a microlens protective layer over the microlens elements.

17. The color filter device of claim 16, wherein the identification mark provides an indication of whether the microlens protective layer is present.

18. The color filter device of claim 16, wherein the microlens protective layer is formed from a photoresist, and the identification mark is formed from the same material as the microlens protective layer.

19. The color filter device of claim 15, wherein the first planarization layer is a layer of a non-photo-sensitive material.

20. The color filter device of claim 15, wherein the first and second planarization layers are layers of non-photosensitive material.

21. The color filter device of claim 18, wherein the identification mark is located adjacent a corner of the microlens protective layer, between two of the bond pads.

* * * * *